(12) United States Patent
Gebuhr et al.

(10) Patent No.: US 9,614,134 B2
(45) Date of Patent: Apr. 4, 2017

(54) LIGHT-EMITTING SEMICONDUCTOR COMPONENT

(71) Applicant: OSRAM Opto Semiconductors GmbH, Regensburg (DE)

(72) Inventors: Tobias Gebuhr, Regensburg (DE); Christian Ziereis, Lappersdorf (DE); Michael Zitzlsperger, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/783,255

(22) PCT Filed: Apr. 9, 2014

(86) PCT No.: PCT/EP2014/057196
§ 371 (c)(1),
(2) Date: Oct. 8, 2015

(87) PCT Pub. No.: WO2014/167021
PCT Pub. Date: Oct. 16, 2014

(65) Prior Publication Data
US 2016/0043291 A1 Feb. 11, 2016

(30) Foreign Application Priority Data

Apr. 9, 2013 (DE) .................. 10 2013 206 186

(51) Int. Cl.
*H01L 33/56* (2010.01)
*H01L 25/00* (2006.01)
(Continued)

(52) U.S. Cl.
CPC .......... *H01L 33/56* (2013.01); *H01L 25/0753* (2013.01); *H01L 25/50* (2013.01);
(Continued)

(58) Field of Classification Search
None
See application file for complete search history.

(56) References Cited

U.S. PATENT DOCUMENTS 9,214,414 B2 12/2015 Oda et al.
2003/0141510 A1 7/2003 Brunner et al.
(Continued)

FOREIGN PATENT DOCUMENTS

DE 102 14 121 C1 12/2003
DE 20 2007 018 552 U1 10/2008
(Continued)

OTHER PUBLICATIONS

Notification of Reasons for Refusal dated Sep. 5, 2016, of corresponding Japanese Application No. 2015-561332 in English.

*Primary Examiner* — Khaja Ahmad
(74) *Attorney, Agent, or Firm* — DLA Piper LLP (US)

(57) ABSTRACT

An optoelectronic component includes a carrier including a mounting surface, at least one light-emitting element arranged on the mounting surface and electrically conductively connected to the carrier, at least one reinforcing body integrated in the optoelectronic component, a housing consisting of a housing encapsulation compound or a housing molding compound, wherein the light emitting component is arranged in an emitter cavity of the housing, and a reinforcing body cavity in which the reinforcing body is arranged fully or partially encapsulated or encased with a reinforcing body encapsulation compound.

14 Claims, 9 Drawing Sheets

(51) Int. Cl.
*H01L 25/075* (2006.01)
*H01L 33/08* (2010.01)
*H01L 33/48* (2010.01)
*H01L 33/54* (2010.01)
*H01L 33/62* (2010.01)

(52) U.S. Cl.
CPC ............ *H01L 33/08* (2013.01); *H01L 33/48* (2013.01); *H01L 33/486* (2013.01); *H01L 33/54* (2013.01); *H01L 33/62* (2013.01); *H01L 2224/48091* (2013.01); *H01L 2224/73265* (2013.01); *H01L 2933/005* (2013.01); *H01L 2933/0033* (2013.01); *H01L 2933/0066* (2013.01)

(56) References Cited

U.S. PATENT DOCUMENTS

| | | |
|---|---|---|
| 2011/0303941 A1 | 12/2011 | Lee |
| 2012/0098110 A1 | 4/2012 | Zitzlsperger et al. |
| 2012/0139003 A1 | 6/2012 | Zitzlsperger et al. |
| 2013/0170208 A1* | 7/2013 | Kuwaharada ........... H01L 33/54 362/243 |

FOREIGN PATENT DOCUMENTS

| | | |
|---|---|---|
| DE | 10 2008 053 489 A1 | 4/2010 |
| DE | 10 2009 031 008 A1 | 12/2010 |
| DE | 10 2011 056 810 A1 | 6/2013 |
| JP | 03-1551 | 1/1991 |
| JP | 2004-193294 | 7/2004 |
| JP | 2005-193638 A | 7/2005 |
| JP | 2012-191233 | 10/2012 |
| WO | 01/82385 A1 | 11/2001 |

\* cited by examiner

LIGHT-EMITTING SEMICONDUCTOR COMPONENT

TECHNICAL FIELD

This disclosure relates to an optoelectronic component.

It claims the priority of DE 10 2013 206 186.2, the contents of which are incorporated herein by reference.

BACKGROUND

Optoelectronic components may, for example, be arranged in a lighting system, usually comprising a carrier with a mounting surface on which at least one light-emitting element is arranged and electrically conductively connects to the carrier by contact surfaces arranged on the mounting surface. The light-emitting element may comprise a light-emitting chip, for example, a light-emitting semiconductor chip. The carrier may be coated with an encapsulation compound consisting of a polymer material, for example, an epoxide compound or silicone compound. Because of the reaction contractions of the encapsulation compound which occur and, furthermore, different expansion behavior between the encapsulation compound and the material of the carrier, undesired deformations or bending of the carrier, or even of the entire component, may take place. Deformations or bending may sometimes lead to process reliability problems and/or quality reductions of components. The larger the components are in terms of their area, the less they can be loaded, this being furthermore due to their small thickness.

To avoid these disadvantages, it is known, for example, to reduce bending or deformation occurring in the component by a subsequent thermal and/or mechanical treatment of the component or individual parts of the component. Mechanical treatment, in particular, represents a great load for the component or the parts of the component so that crack formation or delamination may take place in the component. It is furthermore known to adapt the expansion coefficient of the encapsulation compound to the expansion coefficient of the material of the carrier by adding glass particles, sometimes in a high concentration. The addition of glass particles, however, makes it substantially more difficult to process the respective parts of the component. It is furthermore known to improve the mechanical properties of the component by increasing the component dimensions, for instance increasing the overall height of the component or increasing the thickness of the carrier.

SUMMARY

We provide an optoelectronic component including a carrier including a mounting surface, at least one light-emitting element arranged on the mounting surface and electrically conductively connected to the carrier, at least one reinforcing body integrated in the optoelectronic component, a housing consisting of a housing encapsulation compound or a housing molding compound, wherein the light emitting component is arranged in an emitter cavity of the housing, and a reinforcing body cavity in which the reinforcing body is arranged fully or partially encapsulated or encased with a reinforcing body encapsulation compound.

We further provide a carrier panel for producing optoelectronic components including a lead frame and a housing panel, wherein the lead frame has a plurality of carriers connected to one another, the carriers have a mounting surface, the housing panel includes a housing encapsulation compound or housing molding compound which partially or fully encloses the lead frame and includes emitter cavities configured for arrangement of light-emitting elements on the mounting surface and electrical contacting of the light-emitting elements with the carriers, the carrier panel includes at least one reinforcing body fully or partially enclosed by the housing panel, and the reinforcing body is arranged in a reinforcing body cavity of the housing panel.

We yet further provide a method of producing the optoelectronic components including providing a lead frame including a plurality of carriers connected to one another, which respectively include a mounting surface, arranging one or more reinforcing bodies on a surface of the lead frame, producing a housing panel by encapsulating, encasing or molding around the lead frame with a housing encapsulation compound or a housing molding compound, the housing panel including emitter cavities configured for arrangement of light-emitting elements on the mounting surface and electrical contacting of the light-emitting elements with the carriers, arranging light-emitting elements in the emitter cavities and encapsulating the light-emitting elements with a transmissive encapsulation compound, and separating the carriers of the lead frame, the reinforcing body being fully or partially enclosed by the housing panel.

LIST OF REFERENCES 1 optoelectronic component
2 carrier 3 mounting surface
4 first contact surface
5 second contact surface
6 light-emitting element
7 connecting element
8 cavity
9 housing
10 encapsulation compound
11 surface
12 reinforcing body
13 recess
15 first side surface
16 second side surface
17 first series connection contact surface
18 second series connection contact surface
19 third series connection contact surface
20 housing encapsulation compound
21 emitter cavity
22 reinforcing body cavity
23 first side surface
24 opposite side surface
25 transmissive encapsulation compound
26 reinforcing body encapsulation compound,
30 spatial direction
100 carrier panel
102 edge region
103 component region
105 separating line
106 longitudinal extent
107 side surface
110 lead frame
111 connecting webs
112 individual electrodes
120 housing panel
124 opening of the housing panel

DETAILED DESCRIPTION

We provide an optoelectronic component having an improved geometrical stability with the same component dimensions, a reduced mechanical load and at the same time good processability of the component.

An optoelectronic component may have: a carrier comprising a mounting surface, at least one light-emitting element arranged on the mounting surface and electrically conductively connected to the carrier, and at least one reinforcing body integrated in the optoelectronic component.

By introduction of one or more reinforcing bodies into the optoelectronic component, because of an improved mechanical bending strength of the material composite of the optoelectronic component, a particularly good geometrical stability can be achieved without increasing dimensions of the component, without increasing the mechanical load on the component and/or without impairing the processability of the component. Deformation or bending of the optoelectronic component can be avoided since, by the one or more reinforcing bodies, the stiffness of individual parts of the optoelectronic component and therefore also of the overall optoelectronic component can be improved. Furthermore, the arrangement of reinforcing bodies in the component reduces the stress for the individual parts of the component, since they are not exposed to an additional thermal and/or mechanical load to increase the stability of the component. The arrangement of one or more reinforcing bodies in the component leads to overall reinforcement of the component so that the risk of fracture of the optoelectronic component can be reduced. The reinforcing body may have any desired shape. The reinforcing body may, for example, be configured in the form of an elongate reinforcing rib. The reinforcing body may be also be introduced in various positions into the component during production of the optoelectronic component. It is also possible to arrange a plurality of reinforcing bodies in various positions in the component so that, for example, a controlled increase of the bending strength of individual regions of the optoelectronic component may also be achieved.

The reinforcing body may be made of a metal material, semimetal material, fiber material, ceramic material, polymer material and/or crystal material. As a metal material, aluminum may, for example, be used, for example, anodized aluminum. As a semimetal material, silicon may, for example, be used. As a fiber material, glass fibers, aramid fibers and/or carbon fibers may, for example, be used. As a crystal material, sapphire may, for example, be used. It is also possible to combine with one another a plurality of these materials with respectively different properties to form the reinforcing body to be able to adapt the properties of the reinforcing body optimally to the requirements for the reinforcing body during use in the component.

Integration of the reinforcing body into the optoelectronic component may be carried out by arranging the reinforcing body in a recess formed in the optoelectronic component or on a surface formed in the optoelectronic component. Arrangement of the reinforcing body on a surface may, for example, be carried out in parts of the optoelectronic component having a smaller thickness than the reinforcing body itself. If the parts in which the reinforcing body is arranged of the optoelectronic component have a greater thickness than the reinforcing body, the reinforcing body may be arranged in a recess formed in the part.

After the reinforcing body has been arranged in a recess formed in the component or on a surface formed in the component, the reinforcing body may be at least partially coated with an encapsulation compound or a molding compound so that the reinforcing body may be at least partially encapsulated or encased with an encapsulation compound or a molding compound. For example, silicone compounds or epoxy compounds may be used as an encapsulation compound. Furthermore, the carrier and the light-emitting element may be at least partially encapsulated or encased with the encapsulation compound or molding compound. Before the encapsulation or encasing, the reinforcing body may be fastened on the carrier, for example, by an adhesive bond.

For example, the reinforcing body may be arranged on the carrier of the optoelectronic component. If the reinforcing body is arranged on the carrier, the reinforcing body is, for example, placed on a surface of the carrier and fastened there securely in position. The carrier may, for example, be configured as a lead frame in the form of a thin stamped copper sheet. The carrier may, however, also be configured as a printed circuit board.

The optoelectronic component may furthermore comprise a housing in which case the carrier and the at least one light-emitting element may be arranged in the housing. The housing may, for example, comprise a cavity in which the carrier and the at least one light-emitting element can be arranged. If a plurality of light-emitting elements are provided in the optoelectronic component, and if all the light-emitting elements are arranged in a cavity of the housing, the optoelectronic component may be configured as a so-called LED package. It is, however, also possible for a cavity to be assigned to each light-emitting element in the housing so that each light-emitting element is arranged in a separate cavity of the housing.

If the optoelectronic component has a housing, the reinforcing body may be arranged in the housing. For example, the reinforcing body may be arranged in a recess formed in the housing which are, for example, arranged separately from one or more cavities in the housing in which the carrier and the light-emitting element may be arranged. Arrangement of one or more reinforcing bodies in the housing may be provided as the only reinforcement of the optoelectronic component or alternatively may be provided in addition to one or more reinforcing bodies arranged on the carrier.

Examples of our components are represented in the figures and will be explained in more detail below.

In the following detailed description, reference will be made to the appended drawings, which are part of this description and in which specific examples in which our components may be implemented are shown for illustration. In this regard, direction terminology such as "up", "down", "forward", "backward", "front", "rear" and the like is used with reference to the orientation of the figure or figures being described. Since constituent parts can be positioned in a number of different orientations, the direction terminology is used for illustration and is in no way restrictive. It is to be understood that other examples may be used and structural or logical modifications may be carried out, without departing from the protective scope of the appended claims. It is to be understood that the features of the various examples described herein may be combined with one another, unless specifically indicated otherwise. The following detailed description is therefore not to be interpreted in a restrictive sense, and the protective scope is defined by the appended claims.

In the scope of this description, terms such as "connected" or "coupled" are used to describe both direct and indirect connection, and direct or indirect coupling. In the figures, elements which are identical or similar are provided with identical references, insofar as this is expedient.

Figure 1:
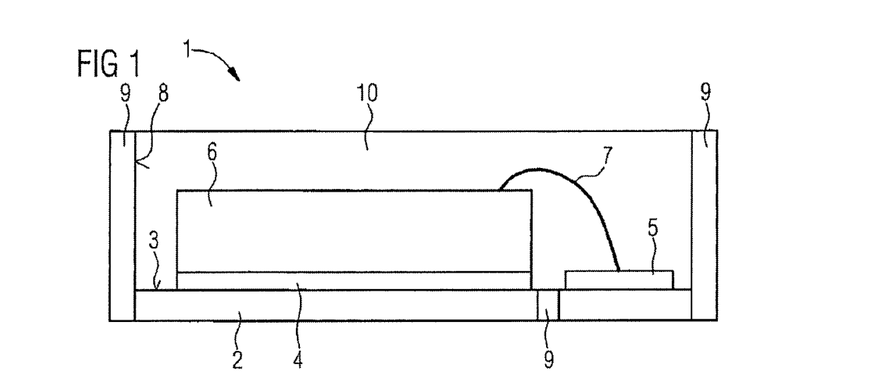
FIG. 1 shows a schematic representation of an optoelectronic component.

FIG. 1 shows an optoelectronic component 1 comprising a carrier 2 with a mounting surface 3 on which a first contact surface 4 and a second contact surface 5 are formed. Arranged on the first contact surface 4, there is a light-emitting element 6 electrically conductively connected via its lower side to the first contact surface 4 and electrically conductively connected to the second contact surface 5 by an electrically conductive connecting element 7, for example, a bonding wire, via its upper side so that the light-emitting element 6 electrically conductively connects to the carrier 2. The carrier 2 and the light-emitting element 6 are arranged together in a cavity 8 of a housing 9 and are at least partially encapsulated or encased with an encapsulation compound 10.

Figure 2:
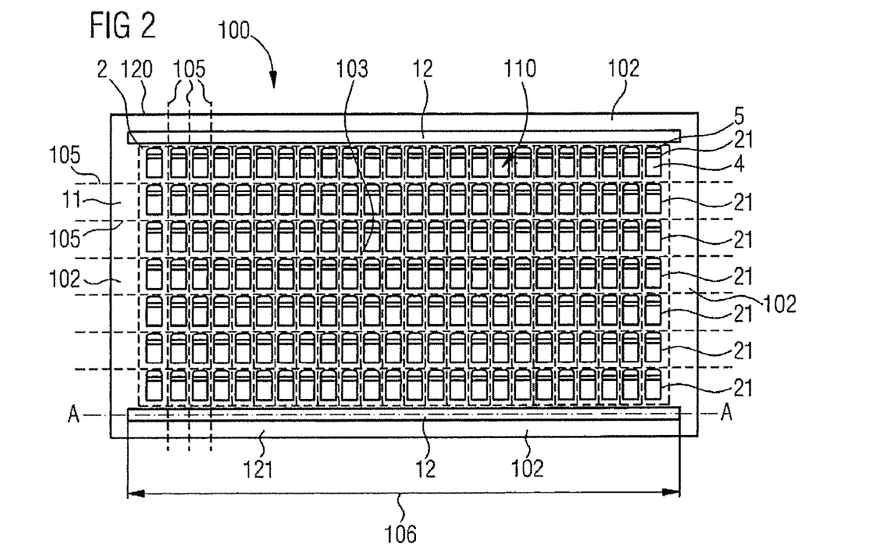
FIG. 2 shows a schematic representation of a carrier configured as a lead frame of the optoelectronic component with reinforcing bodies, and of a carrier panel according to a first example.

FIG. 2 shows a carrier 2 of the optoelectronic component 1 shown in FIG. 1, the carrier 2 being configured in the form of a lead frame formed from a thin stamped copper sheet. Two elongately configured reinforcing bodies 12 are arranged on a surface 11 of the carrier 2, the reinforcing bodies 12 having a substantially longer length than width. The reinforcing bodies 12 are arranged opposite one another on the same surface 11 of the carrier 2 so that the reinforcing bodies 12 are arranged parallel to one another. The reinforcing bodies 12 are respectively arranged adjacent to an edge region of the carrier 2 so that the reinforcing bodies 12 do not interfere with the carrier 2.

During production, the reinforcing bodies 12 are first arranged on the surface 11 of the carrier 2 and fastened securely in position and the carrier 2 together with the reinforcing bodies 12 and the light-emitting element 6 arranged on the carrier 2 are subsequently at least partially encased or encapsulated with the encapsulation compound 10. As an alternative to the introduction of the reinforcing bodies 12 before the encasing or encapsulation, they may however also be inserted or introduced later into recesses provided therefor.

More precisely, FIG. 2 shows a carrier panel 100 for parallel production of a multiplicity of optoelectronic components 1. In this case, a lead frame 110 comprises a multiplicity of carriers 2 delimited by separating lines 105. In this way, process steps required for production of the optoelectronic components 1 can be carried out in parallel for all the optoelectronic components 1, which allows more rapid and more economical production in comparison with separate production of the individual optoelectronic components 1.

Besides the lead frame 110, the carrier panel 100 comprises a housing panel 120. The latter encloses the lead frame 120 at least partially and comprises a housing encapsulation compound 20 which may, for example, be a potting compound or a molding compound. The housing panel 120 may have been produced by an injection molding or injection compression molding method. Suitable materials for making the housing panel 120 are, for example, silicones, epoxy resins or plastics, for instance thermoplastics such as polyphthalamide.

The housing panel 120 comprises a plurality of the emitter cavities 21. These may, for example, be arranged in a rectangular matrix shape and have a uniform spacing in two spatial directions. In FIG. 2, one of the emitter cavities 21 is respectively formed over each carrier 2. At the bottom of the emitter cavities 21, the mounting surface 3 of the carrier 2 is accessible so that the light-emitting element 6 can be placed there and electrically conductively connected to the carrier 2. To this end, both the first contact surface 4 and the second contact surface 5 are exposed by the emitter cavities 21.

The lead frame 110 and the housing panel 120 may be configured to facilitate separation of the carrier panel 100 along the separating lines 105. Separation may, for example, be carried out in the course of individualization of the optoelectronic components 1 produced in the carrier panel 100. In the region of the separating lines 105, the lead frame 110 may, for example, have merely thin separating webs which connect the individual carriers 2 of the lead frame. This simplifies individualization which may, for example, be carried out by sawing or breaking. Before individualization, light-emitting elements 6 may be fitted and these may be encapsulated with an encapsulation compound.

The lead frame 110 may be subdivided into a component region 103 and an edge region 102. The component region 103 comprises the region in which the first contact surfaces 4 and the second contact surfaces 5 of the carriers 2 are arranged. The emitter cavities 21 of the housing panel 120 are also arranged in the component region 103. The edge region 102 encloses the component region 103. It may, for example, be configured to make it easier to pick up and transport the carrier panel 100 during production of the optoelectronic component 1.

The reinforcing bodies 12 are arranged in FIG. 2 in the edge region 102 of the lead frame 110. In this way, the reinforcing bodies 12 are separated during individualization of the optoelectronic components 1 such that none of the optoelectronic components 1 still comprises the reinforcing bodies 12 or a part of the reinforcing bodies 12.

The reinforcing bodies 12 have, in FIG. 2, a longitudinal extent 106 extending over a plurality of carriers 2. They are arranged on the mounting surface 3 of the carriers 2 and can thus reinforce the lead frame 110 during processing. They are furthermore enclosed by housing panel 120 and they may, for example, be encapsulated in the housing panel 120. By applying reinforcing bodies 12 having a large longitudinal extent 106, for example, bending of the lead frame 110 or of the carrier panel 100 during production of the optoelectronic components 1 can be reduced.

Figure 3:
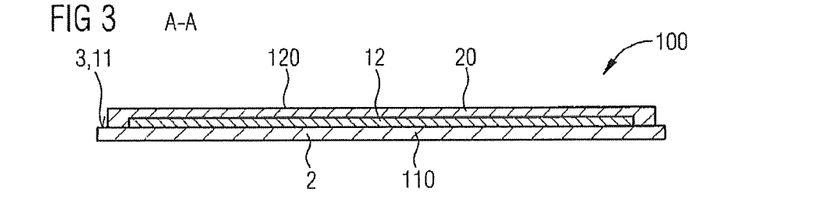
FIG. 3 shows a schematic sectional representation of the representation shown in FIG. 2 along the line A-A.

FIG. 3 shows a sectional representation along the line A-A shown in FIG. 2, in which the reinforcing bodies 12 arranged on the surface 11 of the carrier 2 are at least partially encased or encapsulated together with the carrier 2.

The carrier 2 may be part of a lead frame 110 and, for example, the mounting surface 3 of the carrier 2 may be used as the surface 11. The housing encapsulation compound 20 encloses the reinforcing body 12, for example, on five of its side surfaces while the sixth side surface bears on the lead frame 110.

Figure 4:
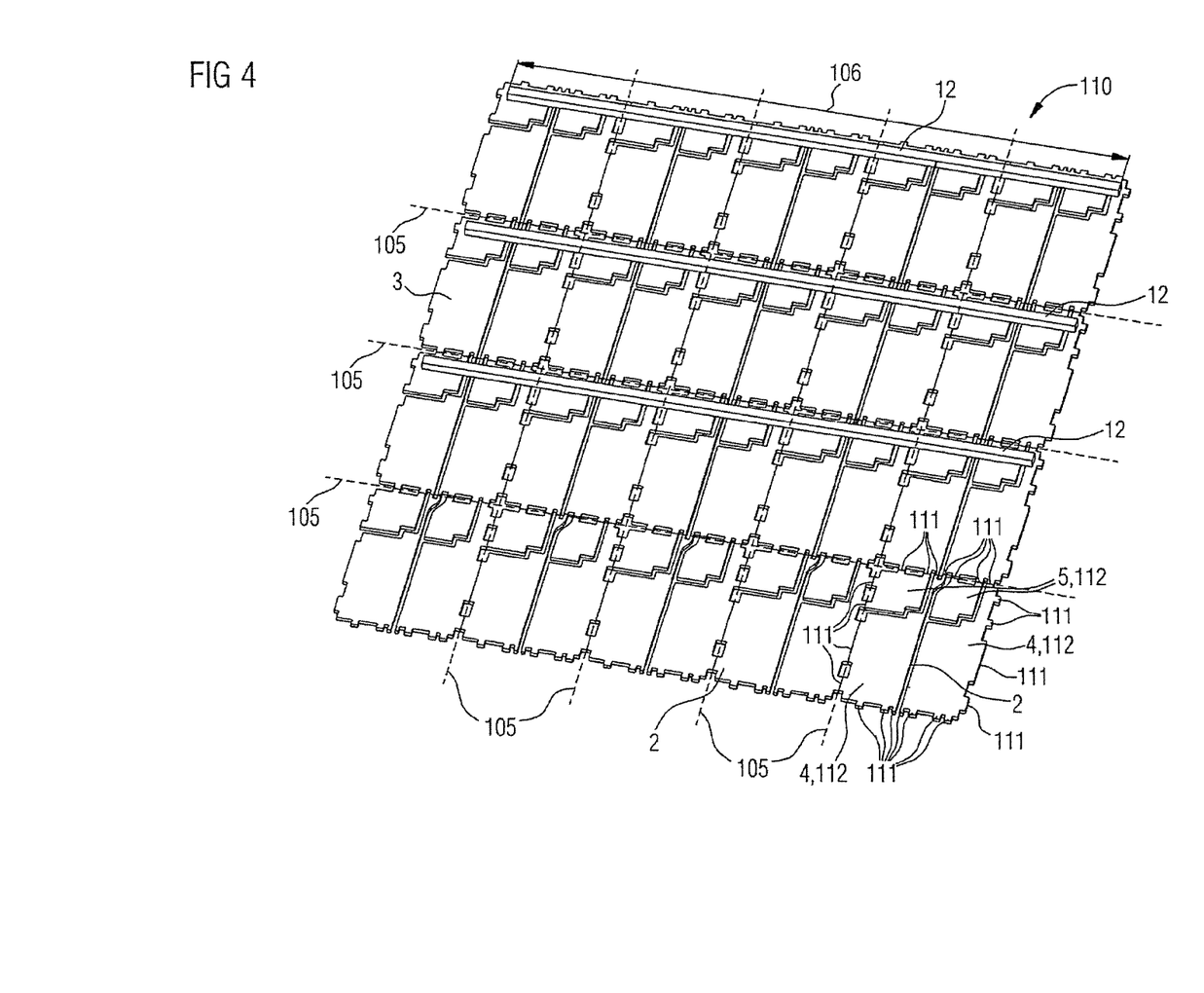
FIG. 4 shows a schematic representation of a lead frame with reinforcing bodies arranged thereon.

FIG. 4 shows a lead frame 110 with reinforcing bodies 12 arranged thereon according to a second example. The lead frame 110 comprises a plurality of carriers 2 delimited by the separating lines 105 indicated in FIG. 4. An optoelectronic component 1 is fabricated on each carrier 2 so that a carrier panel 100 consisting of a plurality of connected components 1 is formed. The parts of the carrier 2 will be described and explained below with the aid of the carrier in the lower left-hand corner of the lead frame 110 all the other carriers 2 having the described parts in a similar way.

The carriers 2 are each configured to contact two light-emitting elements 6. To this end, the carriers 2 comprise four individual electrodes 112, the mounting surfaces 3 of respectively two of the individual electrodes 112 being configured as first contact surfaces 4 and the mounting surfaces 3 of the other two individual electrodes 112 being configured as second contact surfaces 5.

The carriers 2 comprise, at their edge, a plurality of connecting webs 111 which establish a connection to the respectively adjacently arranged carriers 2. The individual electrodes 112 and the connecting webs 111 are shaped and connected to one another such that, after individualization of the optoelectronic components 1 on the basis of the lead frame 110, there is no longer any conductive connection between the individual electrodes 112. The connecting webs 111 are arranged along the separating lines 105 and configured to be narrow. In this way, separation of the connecting webs 111 during individualization of the optoelectronic components 1 can be facilitated.

Three reinforcing bodies 12 are arranged on the lead frame 110. They have a greater longitudinal extent 106 than width, i.e. they are configured in the shape of a rod. Furthermore, the reinforcing bodies 12 have a longitudinal extent 106 extending over a plurality of the carriers 2. The reinforcing bodies may, for example, extend in one direction over the entire lead frame 110. The reinforcing bodies 12 may lead to reinforcement and stiffening of the lead frame 110 in this direction. In particular, bending or fracture of the lead frame 110 during processing of the carrier panel 100 may be prevented. The reinforcing bodies 12 may be securely positioned in position on the lead frame 110, for instance by adhesive bonding.

Figure 5:
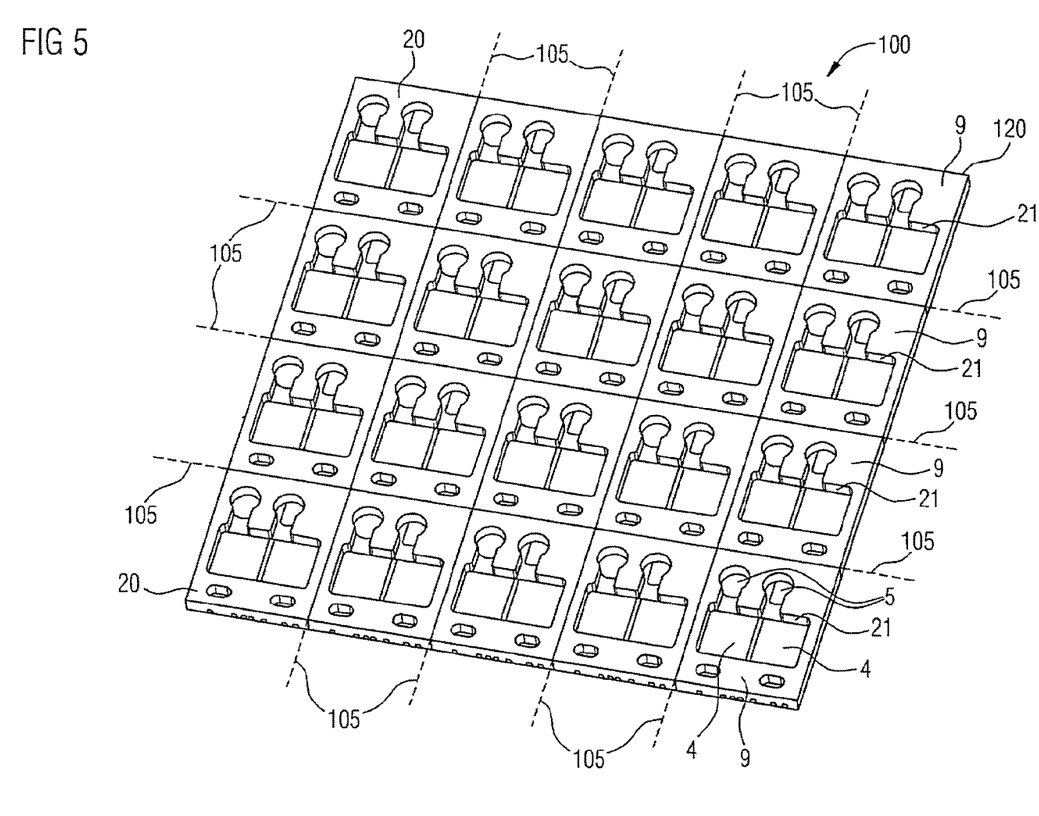
FIG. 5 shows a schematic representation of a carrier panel according to a second example.

FIG. 5 shows a carrier panel 100 according to the second example, comprising the lead frame 110 with reinforcing bodies 12 and a housing panel 120 as represented in FIG. 4. The housing panel 120 represented comprises in total twenty housings 9, connected to one another for an optoelectronic component 1. The housings 9 are respectively delimited by the separating lines 105. Each housing 9 is configured to receive two light-emitting elements 6 and has one emitter cavity 21. At the bottom of the emitter cavities 21, the two first contact surfaces 4 and the two second contact surfaces 5 for contacting the light-emitting elements to be arranged there are accessible.

The housing panel 120 comprises the housing encapsulation compound 20 and may have been fabricated by encapsulating, encasing or molding around the lead frame 110 and the reinforcing bodies 12 with the housing encapsulation compound 20. In the example represented, the housing panel 120 fully encloses the reinforcing bodies 12. After individualization of the optoelectronic components 1, parts of the reinforcing bodies 12 remain in the finished optoelectronic components 1. The remaining parts of reinforcing bodies 12 may then additionally reinforce and stiffen the optoelectronic components 1, particularly in a direction transverse to the separating joint between the individual electrodes 112.

Figure 6:
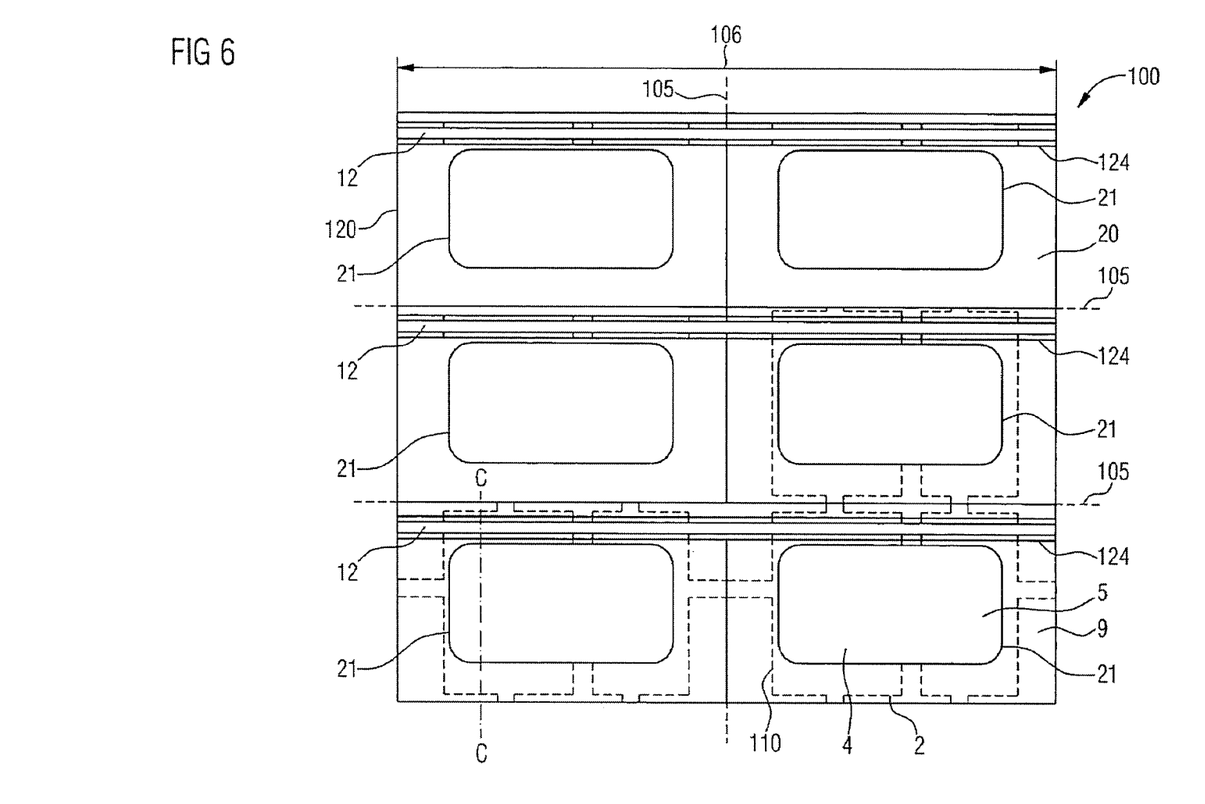
FIG. 6 shows a schematic representation of a carrier panel according to a third example.

FIG. 6 shows a third example of a carrier panel 100 having reinforcing bodies 12, a housing panel 120 and a lead frame 110. The carrier panel 100 comprises six individual housings 9 again delimited by the separating lines 105. In this example, each housing 9 is configured to receive respectively one light-emitting element 6. The emitter cavities 20 of the housing panel 120 therefore allow access to respectively a first and a second contact surface 4, 5 per housing 9.

The reinforcing bodies 12 in the example shown in FIG. 6 are arranged in openings 124 of the housing panel 120. The openings 124 in this case expose the mounting surface 3 of the carriers 2 of the housings 9 so that the reinforcing bodies 12 can be arranged on the mounting surface 3. The reinforcing bodies 12 may in this example, as well as in all the other examples, be placed on the mounting surface 3 or fastened thereon securely in position, for instance by adhesive bonding.

In FIG. 6, the reinforcing body 12 has a longitudinal extent 106 that extends over a plurality of carriers 2. In this way, the reinforcing bodies 12 can lead to stiffening of the carrier panel 100 in the direction of the longitudinal extent 106. The reinforcing bodies 12 remain in the optoelectronic components 1 after individualization of the housings 9 along the separating lines 105, the remaining parts of the reinforcing bodies 12 can also lead to reinforcement of the finished component 1.

Figure 7:
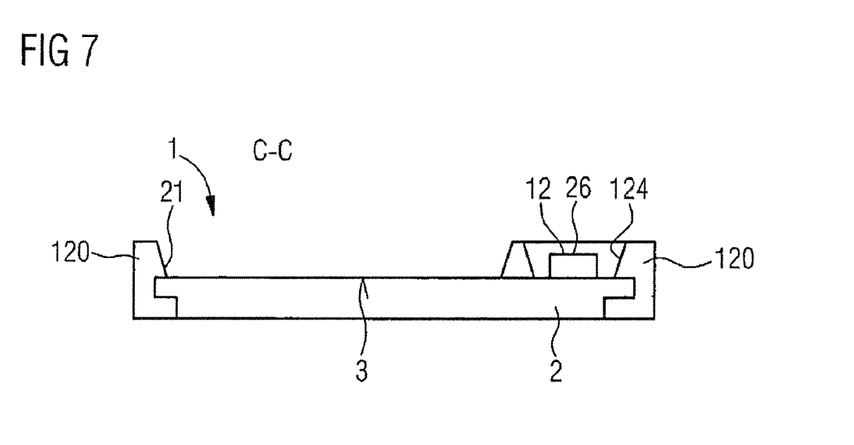
FIG. 7 shows a schematic sectional representation of the carrier panel shown in FIG. 6 along the line C-C after encapsulation of reinforcing bodies.

The carrier panel 100 represented in FIG. 6 may be fabricated by encapsulating, encasing or molding around the lead frame 110 with a housing encapsulation compound 20. At the same time, besides the emitter cavities 21, the openings 124 are also formed. Subsequently, the reinforcing bodies 12 are arranged in the openings 124. The reinforcing bodies 12 may thereupon be encapsulated with a reinforcing body encapsulation compound 26. FIG. 7 shows a schematic sectional representation along the line C-C after the encapsulation of the reinforcing bodies 12 with the reinforcing body encapsulation compound 26.

Figure 8:
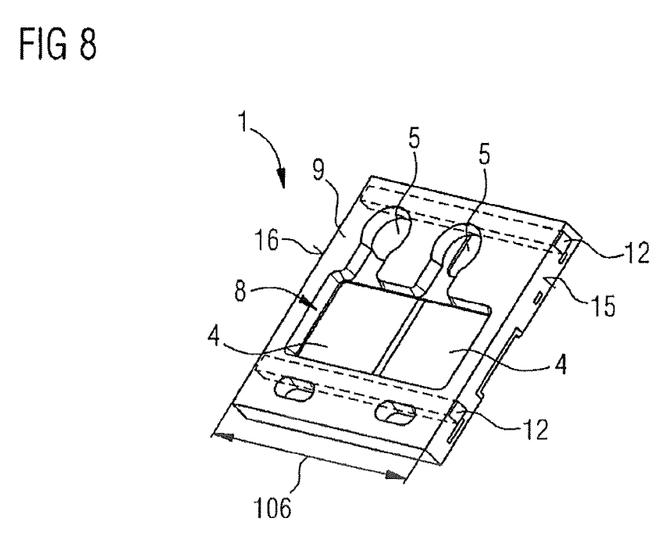
FIG. 8 shows a schematic representation of an optoelectronic component.

By individualization along the separating lines 105, individual optoelectronic components 1 can be fabricated from the carrier panels 100 of the examples represented in FIGS. 5 and 6. FIG. 8 shows a schematic representation of such an optoelectronic component 1, with inter alia the light-emitting element 6 and the encapsulation compound 10 enclosing the latter not being represented. The reinforcing bodies 12 are likewise separated during individualization and, thus, remain in parts in the individual optoelectronic components 1. The parts of the reinforcing bodies 12 then have, in one direction, a longitudinal extent 106 corresponding to the extent of the optoelectronic component 1 in this direction. The ends of the parts of the reinforcing bodies 12 in this case extend through a first side surface 15 of the optoelectronic component 1 and an opposite side surface 24.

Figure 9:
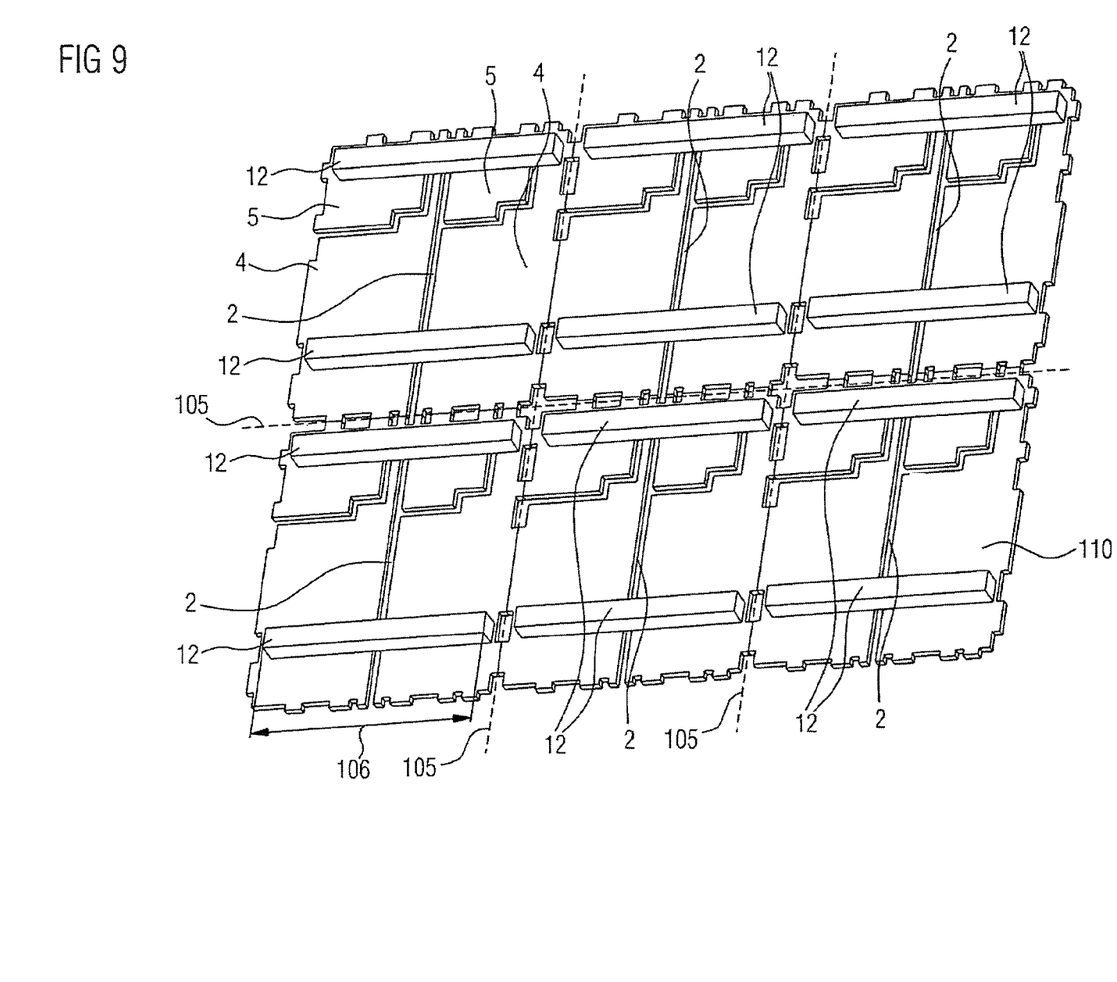
FIG. 9 shows a schematic representation of a further lead frame with reinforcing bodies arranged thereon.

FIG. 9 shows an arrangement consisting of a lead frame 110 and a multiplicity of reinforcing bodies 12 for fabrication of a carrier panel 100 according to a fourth example. The lead frame 110 comprises six individual carriers 2 respectively configured for contacting two light-emitting elements 6 and respectively comprise two first and two second contact surfaces 4, 5. In this example, two reinforcing bodies 12 per carrier 2 are arranged on the lead frame 110. The reinforcing bodies 12 in this case have a longitudinal extent 106 shorter than the extent of the carriers 2 in this direction.

The lead frame 110 and the reinforcing bodies 12 arranged thereon may be encapsulated with a housing encapsulation compound 20 for production of a carrier panel 100 by the injection molding method. After individualization of the optoelectronic components 1 fabricated from the carrier panel 100, by separating the carriers panel 100 along the separating lines 105, the reinforcing bodies 12 remain and are enclosed by housing encapsulation compound 20 because of their shorter longitudinal extent.

Figure 10:
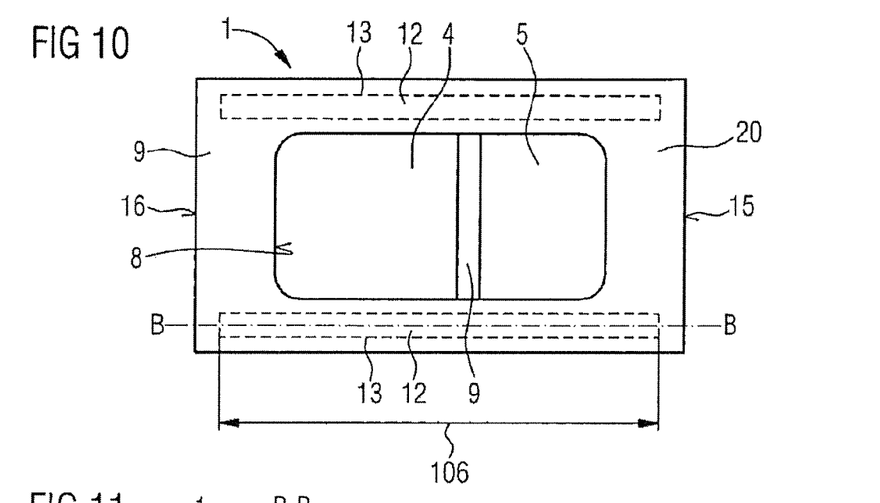
FIG. 10 shows a schematic representation of a housing of the optoelectronic component with reinforcing bodies.
Figure 11:
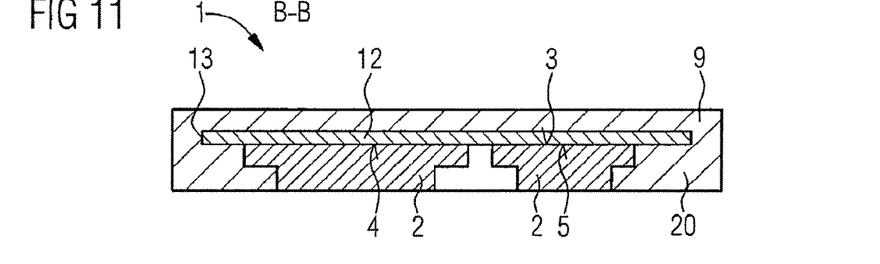
FIG. 11 shows a schematic sectional representation of the representation shown in FIG. 10 along the line B-B.

FIG. 10 shows a configuration of an optoelectronic component 1 in which two reinforcing bodies 12 are arranged in the housing 9 of the optoelectronic component 1. For each reinforcing body 12, a recess 13 in which the reinforcing bodies 12 are placed or inserted is provided in the housing 9. The recesses 13 are arranged separated from the cavity 8 of the housing 9, the recesses 13 being formed in the housing 9 on two mutually opposite sides of the cavity 8 in the configuration shown here. FIG. 11 shows a sectional representation along the line B-B of the configuration shown in FIG. 10.

The configuration of an optoelectronic component 1 as shown schematically in FIG. 10, in which inter alia the light-emitting element 6 and the connecting element 7 are not represented, may be produced by molding around the lead frame 110 represented in FIG. 9 and the reinforcing bodies 12 with the housing encapsulation compound 20 and subsequent individualization along the separating lines 105.

The recesses 13 in which the reinforcing bodies 12 are arranged were formed by molding around the reinforcing bodies 12 with a housing encapsulation compound 20. Since the longitudinal extent 106 of the reinforcing bodies 12 is less than the extent of the carrier 2 and of the housing 9 in the corresponding direction, the reinforcing bodies 12 are fully enclosed by the housing 9 such that neither touch a first side surface 15 nor a side surface 16 opposite the latter. This leads to a side surface with a uniform appearance. It furthermore avoids a continuous planar delimiting surface being formed in the optoelectronic component 1, which would hinder the adhesion of the housing encapsulation compound 20 on the carrier and the reinforcing element 12 arranged thereon. Since the reinforcing bodies 12 do not need to be separated during individualization of the optoelectronic components 1, configuring the reinforcing bodies with a shorter longitudinal extent 106 may facilitate individualization.

As shown in the sectional view represented in FIG. 11 along the line B-B, the reinforcing bodies 13 bear on the mounting surface 3 of the carrier 2 in the region of the first and second contact surfaces 4, 5. By virtue of a firm connection of the individual surfaces of the carrier 2, these are stabilized and stiffened. In this way, the carrier 2 can be made thinner while having an equal stiffness of the optoelectronic component 1.

Figure 12:
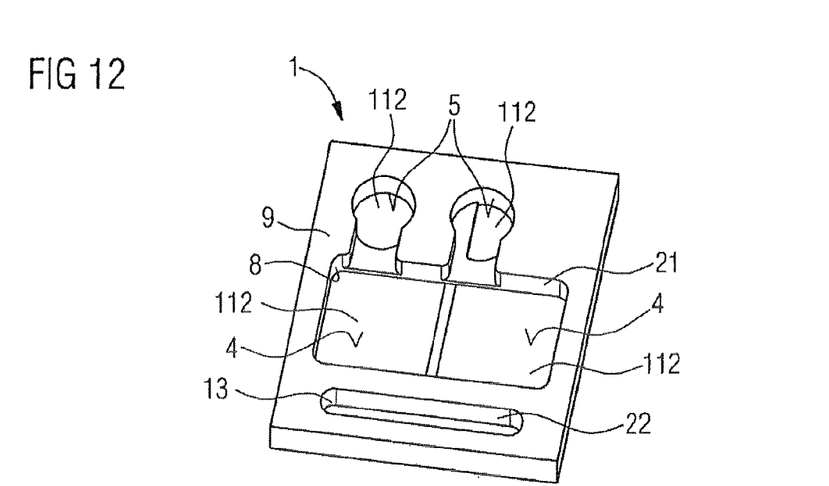
FIG. 12 shows a further schematic representation of a housing of the optoelectronic component without a reinforcing body.
Figure 13:
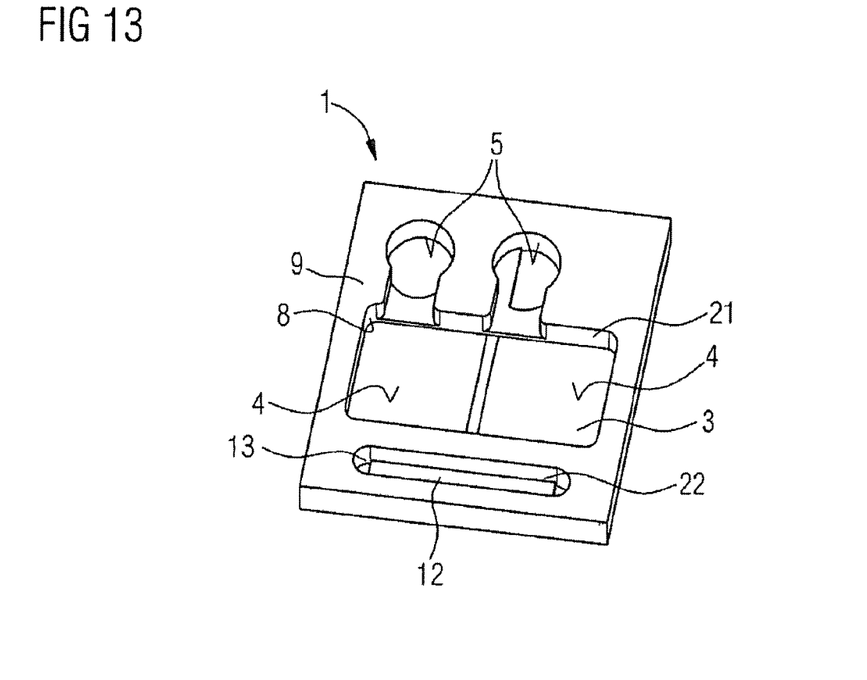
FIG. 13 shows a schematic representation of the housing shown in FIG. 6 with a reinforcing body placed therein.
Figure 14:
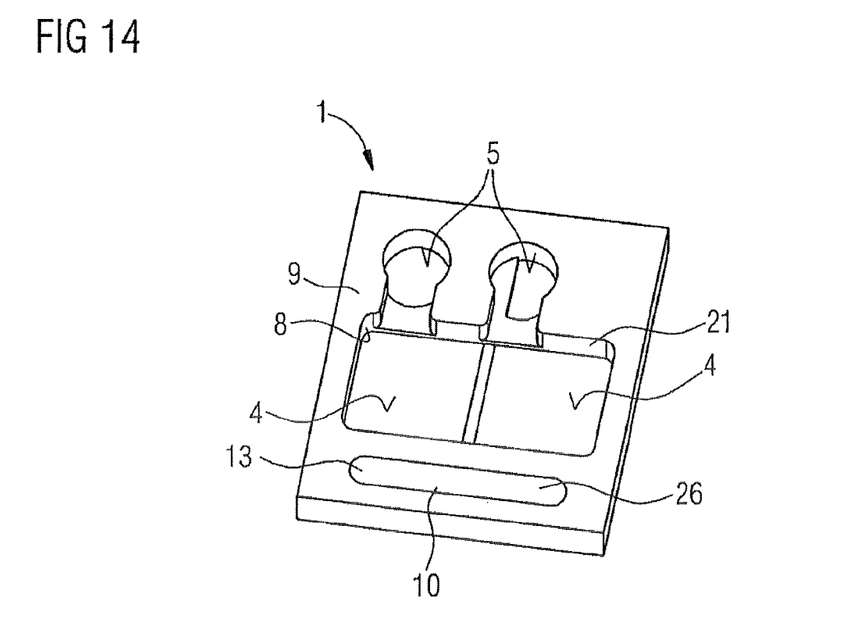
FIG. 14 shows a schematic representation of the housing shown in FIG. 7, in which the reinforcing body is at least partially encapsulated with an encapsulation material.

FIGS. 12-14 show an example of the procedure of arranging a reinforcing body 12 in a housing 9 of an optoelectronic component 1.

FIG. 12 shows the housing 1 with the cavity 9 and the recess 13, further components not yet being arranged in the cavity 9 and a component not yet being arranged in the recess 13.

In FIG. 13, a reinforcing body 12 configured as a reinforcing rib is placed in the recess 13 of the housing 2.

After placement, the reinforcing body 12 arranged in the recess 13 is at least partially encapsulated or encased with the encapsulation compound 10 so that the recess 13 is filled with the encapsulation compound 10 as shown in FIG. 14.

The reinforcing body encapsulation compound 26 formed by the encapsulation compound 10 may in this case comprise a material specially adapted to the reinforcement and stiffening of the optoelectronic component 1, or it may comprise the same material as a transparent encapsulation compound for encapsulating the light-emitting element 6.

Besides the emitter cavity 21, which forms the cavity 8 for the light-emitting element 6, the housing 9 of the example of FIGS. 12-14 comprises a reinforcing body cavity 22 forming the recess 13 for arrangement of the reinforcing body 12. As in the example of FIGS. 9-11, the reinforcing body 12 stiffens and reinforces the individualized optoelectronic component 1 in which it establishes a firm connection between two of the individual electrodes 112.

Figure 15:
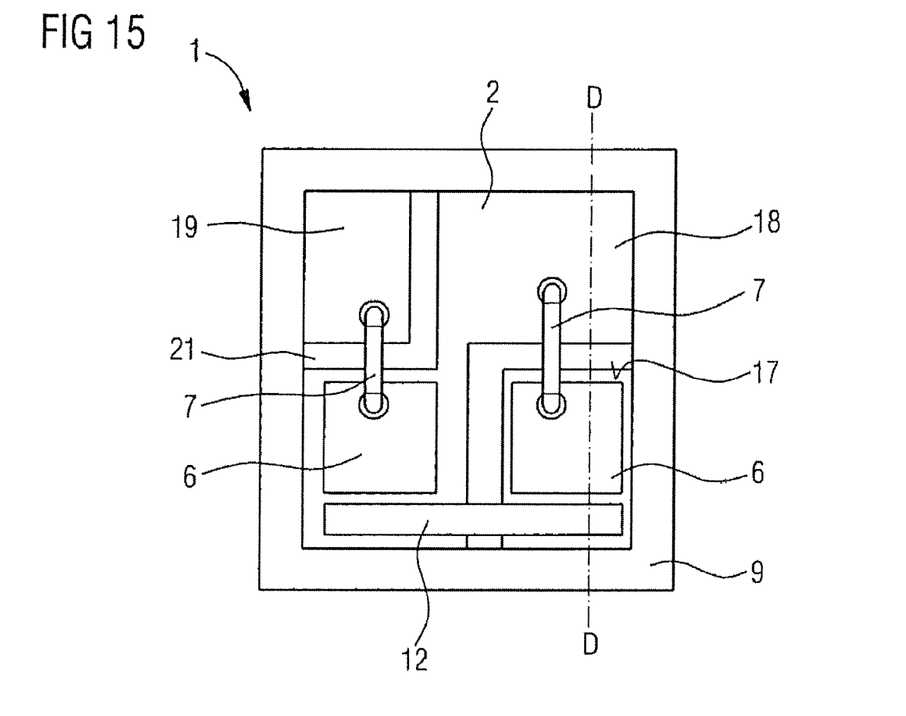
FIG. 15 shows a schematic representation of an optoelectronic component having two light-emitting elements and a reinforcing body.

FIG. 15 shows a schematic representation of an optoelectronic component 1 in which the reinforcing body 12 is arranged inside the emitter cavity 21 configured to receive the light-emitting element 6 in the housing 9. The carrier 2 of the optoelectronic component 1 comprises a first series connection contact surface 17, a second series connection contact surface 18 and a third series connection contact surface 19. A light-emitting element 6 is respectively arranged on the first and second series connection contact surfaces 18, 19. The series connection contact surfaces 17, 18, 19 and the light-emitting elements 6 connect to one another by connecting element 7 such that the light-emitting elements 6 connect in series.

The reinforcing body 12 is arranged in the first cavity 21 such that it reduces movement of the first series connection contact surface 17 relative to the second series connection contact surface 18, and thus leads to stiffening of the optoelectronic component 1.

Figure 16:
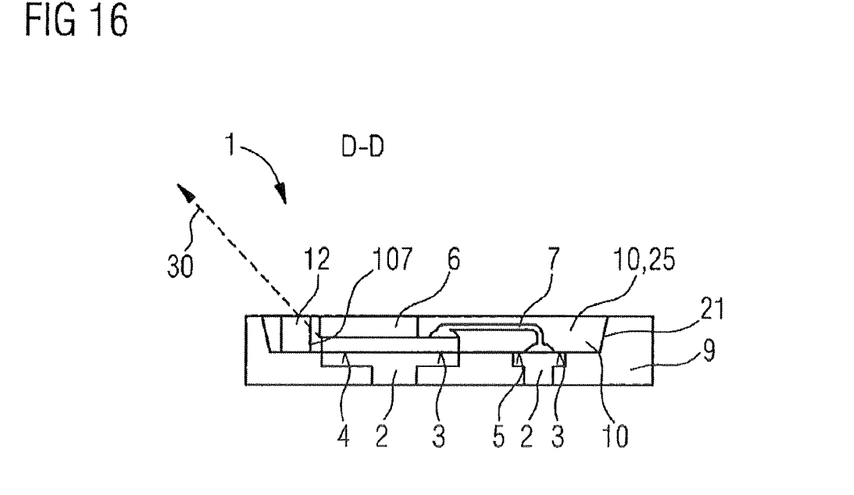
FIG. 16 shows a schematic sectional representation of the representation shown in FIG. 15 along the line D-D.

FIG. 16 shows a sectional representation along the line D-D through the optoelectronic component 1 according to the example of FIG. 15. The light-emitting elements 6 are encapsulated with the encapsulation compound 10, which may be formed by a transmissive encapsulation compound 25. Such encapsulation of the light-emitting elements 6 with the transmissive encapsulation compound 25 may also be carried out in all the other examples of an optoelectronic component 1 which are represented. In the example represented in FIGS. 15-16, both the light-emitting elements 6 and the reinforcing body 12 are encapsulated with the transmissive encapsulation compound 25.

The reinforcing body 12 may be arranged in the vicinity of the light-emitting elements 6 such that it masks the light-emitting elements 6 in a spatial direction 30. To this end, a side surface 107 facing toward the light-emitting elements 6 of the reinforcing body 12 may be configured to absorb light. To achieve optimal masking in the spatial direction 30, the reinforcing body 12 may have the same height as or a greater height than the light-emitting elements 6.

The reinforcing body 12 arranged in the emitter cavity 21 may, however, also comprise a side surface 107 facing toward the light-emitting elements 6, which is configured to be reflecting. In this way, besides reinforcement of the optoelectronic component 1, the reinforcing body 12 may lead to a collimation of the emitted light.

A method of producing the optoelectronic component 1 comprises as one step provision of the lead frame 110 consisting of a plurality of carriers 2 connected to one another, each having a mounting surface 3. As a further step, the method comprises arrangements of the one or more reinforcing bodies 12 on the lead frame 110. In a further step of the method, the housing panel 120 is fabricated by encapsulating, encasing or molding around the lead frame 110 with a housing encapsulation compound 20. This produces the carrier panel 100 which comprises the lead frame 110 and the housing panel 120.

The housing panel 120 in this case comprises the emitter cavities 21 in which in a further step the light-emitting elements 6 are arranged. Subsequently, the light-emitting elements 6 are encapsulated with the transmissive encapsulation compound 25. Lastly, the method comprises individualization of the carrier panel 100 to produce the individual optoelectronic components 1.

In one example of the method, the reinforcing bodies 12 are arranged on the lead frame 110 before production of the housing panel 120. The reinforcing bodies 12 may in this case be arranged on the mounting surface 3 of the carrier and placed in the edge region 100 or in the component 103 of the lead frame 110. They may, for example, additionally be fastened securely in position on the lead frame, for instance by adhesive bonding. Subsequently, the reinforcing bodies 12 together with the lead frame 110 are encapsulated, encased or molded around by the housing encapsulation compound 20. To this end, for example, a transfer molding method may be used.

In this example, the recess 13 in which the reinforcing bodies 12 are arranged, is itself formed during encapsulation of the housing encapsulation compound 20 of the reinforcing bodies 12, and the reinforcing bodies 12 are in material contact with the housing encapsulation material 20. If the reinforcing bodies 12 are arranged in the component region 103 of the lead frame 110, then they remain at least in parts in the individualized optoelectronic components 1 and may lead to reinforcement and stiffening thereof.

If the reinforcing bodies 12 are arranged in the component region 103 of the lead frame 110, they may have a longitudinal extent 106 extending over a plurality of carriers 2 of the lead frame, or they have a longitudinal extent 106 respectively covering merely one of the carriers 2.

If the reinforcing bodies 12 extend over a plurality of carriers 2, fewer reinforcing bodies 12 are needed to cover the lead frame 110 which makes it easier to equip the lead frame 110 with the reinforcing bodies 12. Furthermore, reinforcing bodies 12 extending over a large part of the lead frame 110 can particularly effectively reduce the bending thereof during processing.

If the reinforcing bodies 12 respectively cover only one carrier 2, then the housing encapsulation compound 20 still encloses the reinforcing bodies 12 after individualization as before individualization, as represented in FIG. 10. In this way, the edge surfaces 15, 16 do not comprise interruptions due to the reinforcing bodies 12, which counteracts delamination or fracture of the housing encapsulation compound 20 along the reinforcing bodies 12. Furthermore, individualization of the optoelectronic components 1 is simplified in comparison with long reinforcing bodies 12 since the reinforcing bodies 12 do not have to be separated, for example, sawed through during individualization.

In another example of the method, the reinforcing bodies 12 are arranged on the lead frame 110 after production of the housing panel 120 which may, for example, be carried out by a transfer molding method. To this end, it is possible to form in the housing panel 120 the reinforcing body cavities 22 or the recesses 124, which then respectively form the recesses 13 for receiving the reinforcing bodies 12. The reinforcing bodies 12 may, however, also be arranged inside the first cavity 21 of the light-emitting element 6. In this example as well, the longitudinal extent 106 of the reinforcing bodies 12 may extend over a plurality of carriers 2 or merely respectively cover a single carrier 2.

If the reinforcing bodies 12 are arranged on the lead frame 110 after production of the housing panel 120, then they may be encapsulated in the recesses 13 with an encapsulation compound. This encapsulation compound may be formed by the reinforcing body encapsulation compound 26, the properties of which may be specially adapted to reinforcing and stiffening the lead frame 110 and, for example, good adhesion between the reinforcing body encapsulation compound 26, the reinforcing bodies 12 and the housing encapsulation compound 20.

Above all, if the reinforcing bodies 12 are arranged in the emitter cavities 21, they may also be encapsulated with the transmissive encapsulation compound 25 which also encloses the light-emitting elements 6. This makes it possible to encapsulate the reinforcing bodies 12 and the light-emitting elements 6 with the transmissive encapsulation compound 20 in one working step.

The reinforcing body encapsulation compound 26 and the transmissive encapsulation compound 25 may, for example, comprise an epoxy resin or a silicone. In addition, the transmissive encapsulation compound 25 may contain scattering particles or converter particles.

Reinforcement of the finished optoelectronic components 1 is particularly advantageous in large-area optoelectronic components 1 having a large length and/or width in relation to the component thickness. For example, the optoelectronic components 1 may have a length and width of 1 mm to 10 mm and a thickness of 0.2 mm to 0.8 mm. Reinforcement is particularly advantageous in optoelectronic components 1 comprising more than one light-emitting element 6 since in such optoelectronic components 1, the carriers 2 have a particularly large number of interruptions. The optoelectronic components 1 may, for example, be configured as so-called "quad flat no leads" components (QFN components), in which the contact surfaces for the external contacting are introduced flat into the side surfaces of the optoelectronic component 1.

The lead frame 110 and, therefore, the carrier 2, may, for example, have a thickness of 0.1 mm to 0.4 mm. This can facilitate production of optoelectronic components 1 having a particularly small overall height.

The reinforcing bodies 12 may be made of a nonconductive material and, for example, comprise a plastic, sapphire, a ceramic material, a glass fiber material or an aramid material. They may also comprise conductive material such as metals or semiconductor material. If the parts of the reinforcing bodies 12 remaining in the optoelectronic components 1 fan a plurality of parts, to be electrically insulated from one another, of the carriers 2 then at least the surfaces of the reinforcing bodies 12 are to be configured to be insulating, for example, by a suitable coating.

The reinforcing bodies 12 need not be configured in the shape of a rod to lead to stiffening and reinforcement of the lead frame 110 and/or of the optoelectronic components 1. They may also be angled, for example, right-angled or configured as a rectangular frame. If they are configured as a frame, the light-emitting element 6 may, for example, be arranged inside the frame.

The reinforcing bodies 12 may be arranged on the same side of the carriers 2 as that on which the mounting surface 3 for arrangement of the light-emitting element 6 is arranged. In this case, the optoelectronic components 1 have a planar contact surface on the opposite side so that the optoelectronic components 1 can be fastened straightforwardly on a printed circuit board, for example, by soldering. A planar contact surface also allows configuration of the optoelectronic components 1 as QFN components.

Application fields of large-area optoelectronic components 1 are found inter alia in the field of automobile technology, where they may be used in headlamps or tail lamps. Particularly in the case of headlamps, it is advantageous to mask the light-emitting elements 6, for instance in the illumination for the low beam of a vehicle.

The invention claimed is:

1. An optoelectronic component comprising:
   a carrier comprising a mounting surface,
   at least one light-emitting element arranged on the mounting surface and electrically conductively connected to the carrier,
   at least one reinforcing body integrated in the optoelectronic component and configured as an elongated rod and placed on the mounting surface of the carrier,
   a housing consisting of a housing encapsulation compound or a housing molding compound, wherein the light emitting component is arranged in an emitter cavity of the housing,
   the housing at least partially encloses the carrier,
   a transmissive encapsulation compound fills the emitter cavity and encapsulates the light-emitting element, and
   a reinforcing body cavity in which the reinforcing body is arranged fully or partially encapsulated or encased with a reinforcing body encapsulation compound.

2. The optoelectronic component as claimed in claim 1, wherein the reinforcing body is arranged on the carrier.

3. The optoelectronic component as claimed in claim 1, wherein the reinforcing body is nonconductive and comprises at least one of a fiber material, a ceramic material, a crystal material, a plastic material or a polymer material.

4. The optoelectronic component as claimed in claim 1, wherein the reinforcing body has a longitudinal extent extending from a first side surface of the optoelectronic component to an opposite side surface of the optoelectronic component.

5. A carrier panel for producing optoelectronic components comprising a lead frame and a housing panel, wherein
   the lead frame has a plurality of carriers connected to one another,
   the carriers have a mounting surface,
   the housing panel comprises a housing encapsulation compound or housing molding compound which partially or fully encloses the lead frame and comprises emitter cavities configured for arrangement of light-emitting elements on the mounting surface and electrical contacting of the light-emitting elements with the carriers,
   the carrier panel comprises at least one reinforcing body configured as an elongated rod, placed on the mounting surface and fully or partially enclosed by the housing panel, and
   the reinforcing body is arranged in a reinforcing body cavity of the housing panel.

6. The carrier panel as claimed in claim 5, wherein the reinforcing body is nonconductive and/or comprises at least one of a fiber material, a ceramic material, a crystal material, a plastic material or a polymer material.

7. The carrier panel as claimed in claim 5, wherein the reinforcing body is arranged in an edge region of the lead frame.

8. The carrier panel as claimed in claim 5, wherein the reinforcing body is arranged in a component region of the lead frame.

9. The carrier panel as claimed in claim 5, wherein the reinforcing body has a longitudinal extent extending over a plurality of carriers.

10. The carrier panel as claimed in claim 5, wherein the carrier panel comprises:
    a plurality of reinforcing bodies, and
    the at least one reinforcing body is respectively arranged on each carrier.

11. A method of producing the optoelectronic components as claimed in claim 1, comprising:
    providing a lead frame comprising a plurality of carriers connected to one another, which respectively comprise a mounting surface,
    placing one or more reinforcing bodies on the mounting surfaces of the lead frame,
    producing a housing panel comprising a plurality of housings connected to one another by encapsulating, encasing or molding around the lead frame with a housing encapsulation compound or a housing molding compound,
    the housing panel comprising emitter cavities in each of the housings configured for arrangement of light-emitting elements on the mounting surface and electrical contacting of the light-emitting elements with the carriers,
    arranging light-emitting elements in the emitter cavities and encapsulating the light-emitting elements with a transmissive encapsulation compound after having produced the housing panel, and
    separating the carriers of the lead frame and the housings of the housing panel,
    wherein the reinforcing body is fully or partially enclosed by the housing panel, and
    the reinforcing body is configured as an elongated rod.

12. The method as claimed in claim 11, wherein the reinforcing body is arranged in an edge region or a component region of the lead frame.

13. The method as claimed in claim 11, wherein the reinforcing body is arranged on the lead frame before production of the housing panel, and is partially or fully encapsulated, molded around or encased with the housing encapsulation compound or housing molding compound during production of the housing panel.

14. The method as claimed in claim 11,
    wherein the reinforcing body is arranged in the emitter cavities of the housing panel after production of the housing panel, and
    encapsulated with the transmissive encapsulation compound.

* * * * *